(12) United States Patent
Suzuki

(10) Patent No.: US 6,582,524 B2
(45) Date of Patent: Jun. 24, 2003

(54) METHOD FOR WASHING WAFER AND APPARATUS USED THEREFOR

(75) Inventor: Tatsuya Suzuki, Tokyo (JP)

(73) Assignee: NEC Electronics Corporation (JP)

(*) Notice: Subject to any disclaimer, the term of this patent is extended or adjusted under 35 U.S.C. 154(b) by 97 days.

(21) Appl. No.: 09/749,236

(22) Filed: Dec. 27, 2000

(65) Prior Publication Data

US 2001/0039956 A1 Nov. 15, 2001

(30) Foreign Application Priority Data

Dec. 28, 1999 (JP) .......................................... 11-372658

(51) Int. Cl.$^7$ ................................................. C23G 1/14
(52) U.S. Cl. .............................. 134/2; 134/26; 134/27; 134/29; 134/34; 134/36; 134/42; 134/902
(58) Field of Search ............................... 134/2, 26, 27, 134/29, 34, 36, 42, 902

(56) References Cited

U.S. PATENT DOCUMENTS 5,520,744 A * 5/1996 Fujikawa et al. ......... 134/102.1
5,656,097 A * 8/1997 Olesen et al. ................... 134/1
5,962,384 A * 10/1999 Cooper et al. ................. 134/2
6,146,467 A * 11/2000 Takaishi et al. ............... 134/2
6,273,099 B1 * 8/2001 Chang et al. ................ 134/1.3
2001/0047815 A1 * 12/2001 Biebl et al.

FOREIGN PATENT DOCUMENTS

JP          10-12585          1/1998

* cited by examiner

Primary Examiner—Sharidan Carrillo
(74) Attorney, Agent, or Firm—Scully, Scott, Murphy & Presser

(57) ABSTRACT

A method including the consecutive steps of: dipping a wafer in a washing solution in a washing chamber; replacing the washing solution by a first chemical solution in the washing chamber receiving therein the wafer, the first chemical solution including at least one chemical; dipping the wafer in the first chemical solution after stopping the replacing; and replacing the first chemical solution by a second chemical solution including the at least one chemical and having a concentration lower than a concentration of said first chemical solution. The number of the particles remaining on the wafer is significantly reduced compared with a conventional method to improve the removing rate of the particles deposited onto the wafer.

6 Claims, 8 Drawing Sheets

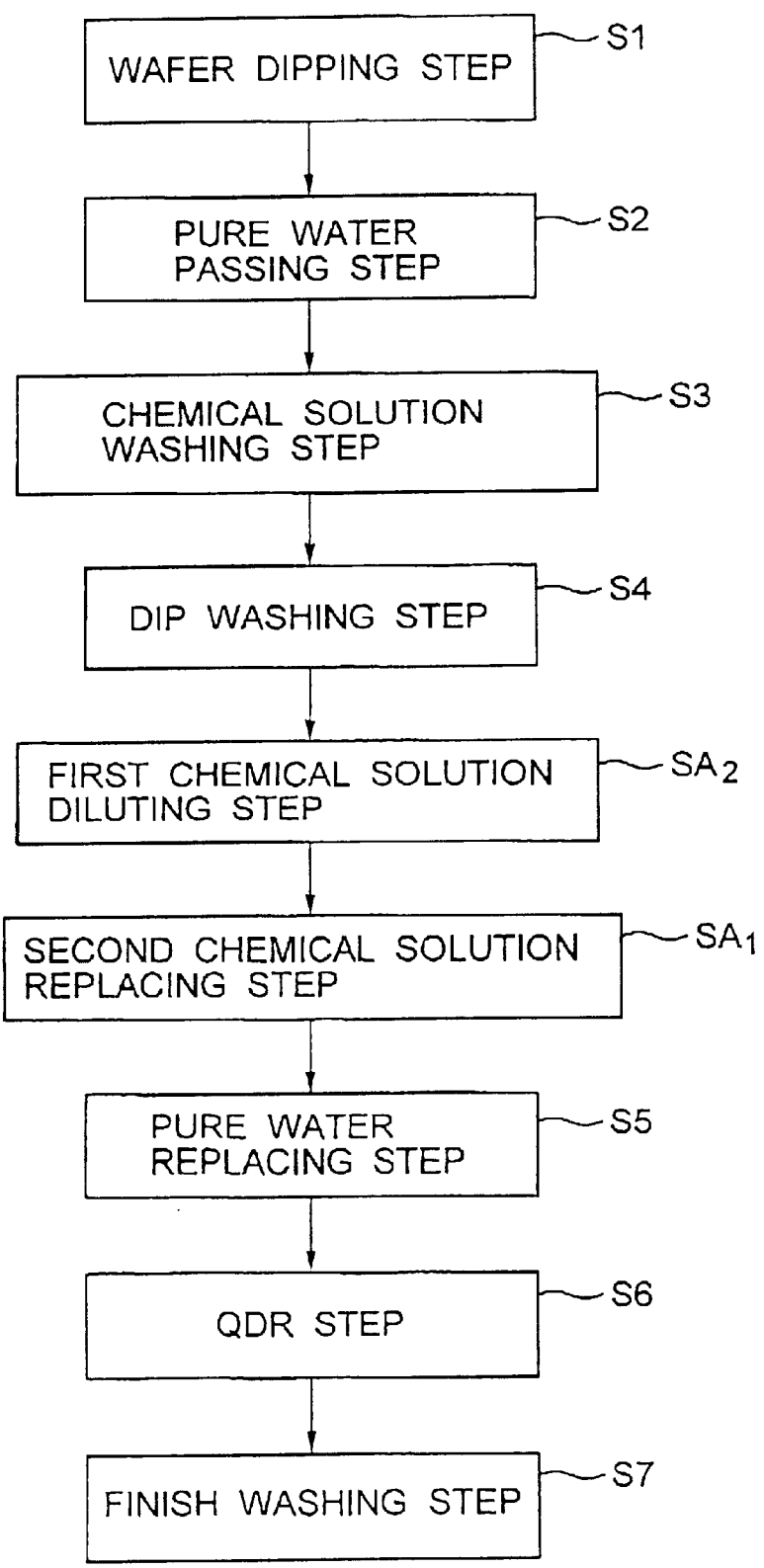

METHOD FOR WASHING WAFER AND APPARATUS USED THEREFOR

BACKGROUND OF THE INVENTION (a) Field of the Invention

The present invention relates to a method for washing wafers and an apparatus for washing wafers, more in particular to the method and the apparatus for washing the wafers in which the removing rate of particles deposited onto the wafers is higher than that of a conventional method or apparatus.

(b) Description of the Related Art

In the manufacture of a semiconductor device, a wafer is washed for removing foreign substances, impurities and contaminations upon completion of each of process steps. The wafer is also frequently washed in pretreatment steps such as an initial washing step before processing a silicon substrate, a pre-oxidation washing step before deposition of a silicon oxide film on the silicon substrate, a washing step before ion implantation and a further washing step before deposition of a CVD film As shown in FIGS. 1 and 2, a conventional wafer washing apparatus 10 known as a single vessel-type apparatus includes an inner chamber 12 for washing wafers with a washing solution composed of pure water and a chemical accommodated therein, an outer chamber 14 which surrounds the periphery of the inner chamber 12 and to which the washing solution overflows from the inner chamber 12, a pure water supplying apparatus (not shown) and a chemical solution supplying apparatus (not shown).

In the wafer washing apparatus 10, a plurality of wafers "W" disposed on a lifter 16 in an upright posture and separated from one another are transferred into the inner chamber 12 and washed at a time.

The lifter 16 includes a mounting table 16a having, for example, a width "$W_1$" of 140 mm and a depth "$L_1$" of about 180 mm and a gripping plate 16b extending upright from the deepest edge of the mounting table 16a.

The mounting table 16a has a central bottom line and is higher toward the both ends of the table. Both the ends are higher than the central bottom line by a height "$H_1$" of 30 mm. The mounting table 16a includes a plurality of holding trenches 16c extending parallel to the gripping plate 16b and separated from one another. The wafer "W" is fixed onto the mounting table 16a by engaging the bottom of the wafer "W" into the holding trench 16c.

The inner chamber 12 is rectangular parallelepiped with a top opening having dimensions capable of accommodating the lifter 16 with the plurality of wafers, for example, a width "$W_2$" of 220 mm, a depth "$L_2$" of 200 mm and a height "$H_2$" of 230 mm, and an inner volume thereof is about 10 liters.

The inner chamber 12 further includes pipes 18A and 18B having nozzles for ejecting the chemical solution and the pure water at both ends of the width direction of the inner chambers 12, and a QDR (quick dump rinsing) drain port 20 having a large opening at the bottom thereof for rapidly discharging the chemical solution and the pure water in the inner chambers 12.

The outer chamber 14 includes sidewalls disposed outer than those of the inner chambers 12 by about 30 mm, designated by "S" in FIG. 1. The sidewalls of the outer chamber 12 have a height "$H_3$" of 230 mm which is lower than the sidewalls of the inner chamber 12 by 0 to 5 mm ($\Delta h$) as shown in FIG. 1. The outer chamber 14 further includes, at the bottom thereof, a port 22 for discharging the pure water and d the chemical solution overflown from the inner chamber 12.

Referring to a flow chart of FIG. 3 in addition to FIGS. 1 and 2, the method of washing the wafers by using the conventional wafer washing apparatus 10 will be described.

At first, pure water is supplied to the inner chamber 12 at a rate of 5 liter/min. through the pipes 18A and 18B and is allowed to be over-flown from the inner chamber 12 to the outer chamber 14. While maintaining the overflow of the pure water, the lifter 16 mounting the wafers is dipped into the pure water in the inner chamber 12 ($S_1$: wafer dipping step).

Then, pure water is supplied to the inner chamber 12 at a flow rate of 20 liter/min. for 2 minutes through the pipes 18A and 18B ($S_2$: pure water upward flowing step).

After the supply of the pure water is stopped, the chemical solution including ammonia ($NH_4OH$), hydrogen peroxide ($H_2O_2$) and pure water in a volume ratio of 1:1:50 is supplied to the inner chamber 12 at a flow rate of 20.8 liter/min. for 120 seconds through the pipes 18A and 18B for washing the wafers ($S_3$: chemical solution upward flowing step).

After the supply of the chemical solution is stopped, the so-called dip washing is conducted for about 480 seconds while the wafers disposed on the lifter 16 are dipped in the chemical solution ($S_4$: dip washing step).

Only pure water is supplied to the inner chamber 12 at a flow rate of 20 liter/min. for 30 seconds, in view of the fact that the volume of the inner chamber 12 is about 10 liters, through the pipes 18A and 18B for replacing the chemical solution in the inner chamber 12 with the pure water ($S_5$: pure water replacing step).

Then, QDR is conducted ($S_6$: QDR step). In the QDR washing, at first, the QDR drain port 20 is released to discharge the pure water in the inner chamber 12 supplied thereto in the pure water replacing step $S_5$. After the QDR drain port 20 is stopped to fill the inner chamber 12 with the pure water, the QDR drain port 20 is released again to discharge the pure water in the inner chamber 12. The procedures are repeated five or six times.

Then, only pure water is supplied to the inner chamber 12 at a flow rate of 20 liter/min. for 90 seconds through the pipes 18A and 18B, and a specific resistance of the pure water in the inner chamber 12 is confirmed to be substantially same as that of the pure water before the supply to the inner chamber 12, the lifter is lifted to transfer the wafers to a drying chamber not shown ($S_7$: finish washing step).

When the wafers are washed in accordance with the above procedures by using the single vessel-type wafer washing apparatus, the removing rate of particles deposited onto the wafer is poor and the washing of the wafers cannot be conducted satisfactorily.

The number of the particles deposited onto the wafer after the washing is high, and the washing is insufficient as a pretreatment or a post-treatment of a process for forming a finer pattern in a semiconductor device.

With the higher miniaturization and the higher integration of the semiconductor device, the miniaturization is more and more demanded together with the higher accuracy. Accordingly, the sufficient washing of the wafers meeting the higher accuracy processing cannot be achieved in the conventional wafer washing method.

SUMMARY OF THE INVENTION

In view of the foregoing, an object of the present invention is to provide a method for washing wafers and an apparatus for washing wafers which can be satisfactorily used as a pretreatment or a post-treatment of processing a semiconductor device by employing a single vessel-type wafer washing apparatus.

Thus, the present invention provides, in a first aspect thereof, a method including the consecutive steps of: dipping a wafer in a washing solution in a washing chamber; replacing the washing solution by a first chemical solution in the washing chamber receiving therein the wafer, the first chemical solution including at least one chemical; dipping the wafer in the first chemical solution after stopping the replacing; and replacing the first chemical solution by a second chemical solution including the at least one chemical and having a concentration lower than a concentration of said first chemical solution.

In accordance with the present invention, the particles floating in the first chemical solution is over-flown from the washing chamber together with the first chemical solution by replacing the first chemical solution with the second chemical solution, thereby discharging the particles from the washing chamber. Even if the particles are re-deposited onto the wafer in the second chemical solution supply step, the deposited particles are released by the releasing ability of the second chemical solution, thereby overflowing the particles from the washing chamber together with the first chemical solution.

Accordingly, the number of the particles remaining on the wafer is significantly reduced compared with a conventional method to improve the removing rate of the particles deposited onto the wafer.

The present invention provides, in a second aspect thereof, a wafer washing apparatus including a washing chamber having drain port at a bottom thereof, a wafer mount for mounting thereon a plurality of wafers in an upright posture with a space therebetween, and a washing nozzle ejecting a washing solution to the wafers in an oblique and downward direction.

In accordance with the second aspect of the present invention, the washing apparatus for suitably conducting the washing method of the first aspect can be realized.

The above and other objects, features and advantages of the present invention will be more apparent from the following description.

BRIEF DESCRIPTION OF DRAWINGS

FIG. 8 is a flow chart showing procedures of washing a wafer in accordance with a third embodiment of the present invention.

PREFERRED EMBODIMENTS OF THE INVENTION

Figure 1:
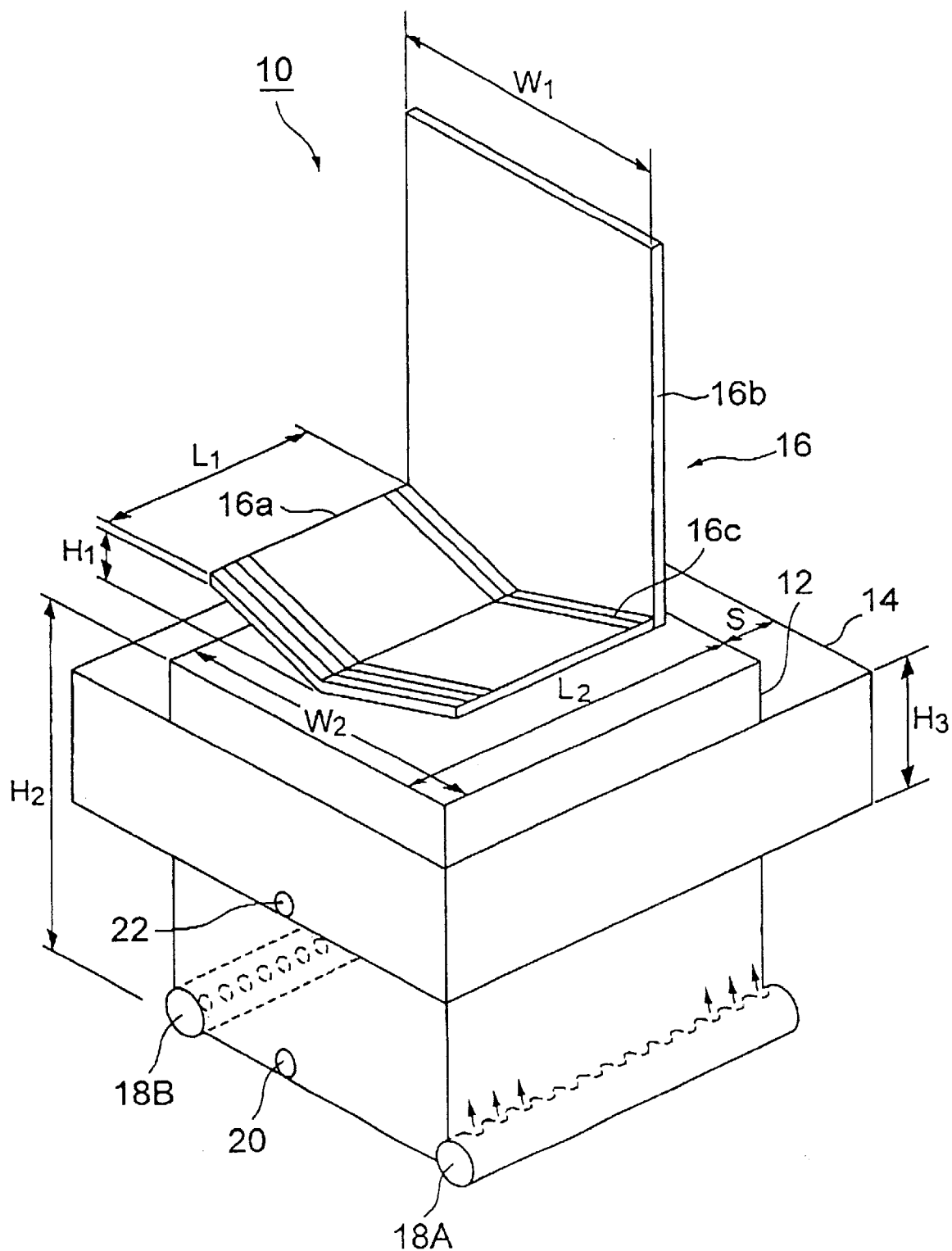
FIG. 1 is a perspective view showing a conventional wafer washing apparatus.

The present inventor has found the following after the research of reasons of the lower wash efficiency of the conventional washing method using the single vessel-type wafer washing apparatus.

In the conventional method, a washing treatment with a chemical ($S_4$: dip washing step) and a rinsing treatment with water ($S_6$: QDR step) are conducted in a single chamber. Accordingly, a chemical solution is replaced with pure water before the QDR step $S_6$ ($S_5$: pure water replacing step).

Although particles released from the wafer in the dip washing step and floating in an inner chamber are overflown and discharged together with the chemical solution from the inner chamber to the outer chamber in the pure water replacing step, the particles are, in fact, re-deposited onto the wafer during the pure water replacing step.

After the dip washing step, the chemical solution including a plurality of the particles floating thereon is replaced with pure water. In the pure water replacing step, at first, the chemical solution is diluted (replaced) with the pure water until the lowest limit of concentration of the chemical solution having the ability of releasing the particles is reached. Before reaching to the lowest limit, if the particles are re-deposited onto the wafer, the particles are again released and discharged together with the chemical solution. However, when the chemical solution is further diluted with the pure water to a lower concentration below the lowest limit, the particles deposited onto the wafer are not released and remain on the wafer. As a result, the wafer having the particles thereon is taken out and transferred to a drying step.

In other words, since the chemical solution is simply replaced with the pure water without preventing the re-adhesion of the particles in the pure water replacing step in the conventional wafer washing method, the particles are likely to be re-deposited onto the wafer with the progress of the pure water replacement. Accordingly, the improvement of the removing rate of the particles is difficult.

The present inventor has obtained a conception that during the replacement of the chemical solution in the inner chamber with the pure water, at first, a first chemical solution in the inner chamber is replaced with a second chemical solution having the chemical concentration of the lowest limit and the ability of releasing the particles, thereby overflowing and discharging the particles floating on the first chemical solution from the inner chamber to the outer chamber while replacing the first chemical solution with the second chemical solution. After repeated experiments, the present invention has been completed.

The washing apparatus used in the method of the present invention includes the above-described single vessel-type wafer washing apparatus having the pipes including the nozzles for ejecting the chemical solution and the pure water disposed at the bottom of the washing chamber (inner chamber and outer chamber), and a wafer washing apparatus of the present invention having pipes, disposed at the upper part of the washing chamber, including nozzles for obliquely and downward ejecting the chemical solution and the pure water to the wafer.

The washing water used in this text refers to clean water having no dissolved chemical substances and no particles. Pure water is suitably used as the washing water. The pure water refers to that frequently used in a semiconductor device manufacturing factory, prepared by treating service water, and classified as pure water.

Particles used in this text includes ultra-fine substances deposited onto the wafer in addition to a variety of fine particles and fine substances such as foreign substances, impurities and contaminations.

In the wafer dipping step, the wafer is dipped in the washing chamber while the washing water is supplied to the washing chamber. Upon the completion of the wafer dipping step, the supply of the washing water preferably continues for a while. The length of time thereof is such that the washing water having a volume about two to four times that of the washing chamber is supplied.

In the first chemical solution supplying step, the length of time of washing the wafer with the first chemical solution is such that the washing water having a volume about two to four times that of the washing chamber is supplied.

The first chemical solution preferably comprises ammonia and hydrogen peroxide as the chemicals and also comprises water in a volume ratio between the chemicals and water of $2:X_1$, wherein $20 \leq X_1 \leq 70$.

In the dip washing step, the length of time of washing is between 5 and 10 minutes.

In the further washing step, the QDR washing is preferably conducted. The number of the washings is between 4 and 7. The QDR washing has an effect of discharging the washing water in the washing chamber at once, thereby efficiently discharging the particles in the washing chamber.

In the method of the present invention, the second chemical solution is supplied to the washing chamber between the dip washing step and further washing step. The second chemical solution has the washing ability and the lower concentration of the chemical such as ammonia, hydrogen peroxide and ozone than that of the first chemical solution for replacing the first chemical solution therewith.

In an embodiment of the present invention, the volume of the second chemical solution is not less than a volume of the washing chamber.

The washing ability refers to that releasing the particles deposited onto the wafer with means of physical adsorption by van der Waals attraction. The concentration of the second chemical solution is preferably adjusted to the lowest limit in the range having the washing ability for increasing the dilution efficiency of the first chemical solution with the second chemical solution. In practice, $80 \leq X_2 \leq 150$, or the content of the water in the chemical solution in the above range can release the particles physically adsorbed.

When the wafer is washed in the method of the present invention by using the conventional wafer washing apparatus, the uniform dilution (replacement) of the first chemical solution in the washing chamber is hardly conducted because the washing water is upward-directed. The particles are easily deposited onto the bottom part of the wafer because the pipes for ejecting the chemical solution and the pure water are disposed at the bottom.

The present inventor has conceived that the pipes having the nozzles are disposed at an upper part of the washing chamber, thereby obliquely and downward ejecting the chemical solution and the washing water. After repeated experiments, the wafer washing apparatus of the present invention has been completed.

Now, the present invention is more specifically described with reference to accompanying drawings.

Embodiment 1

Figure 3:
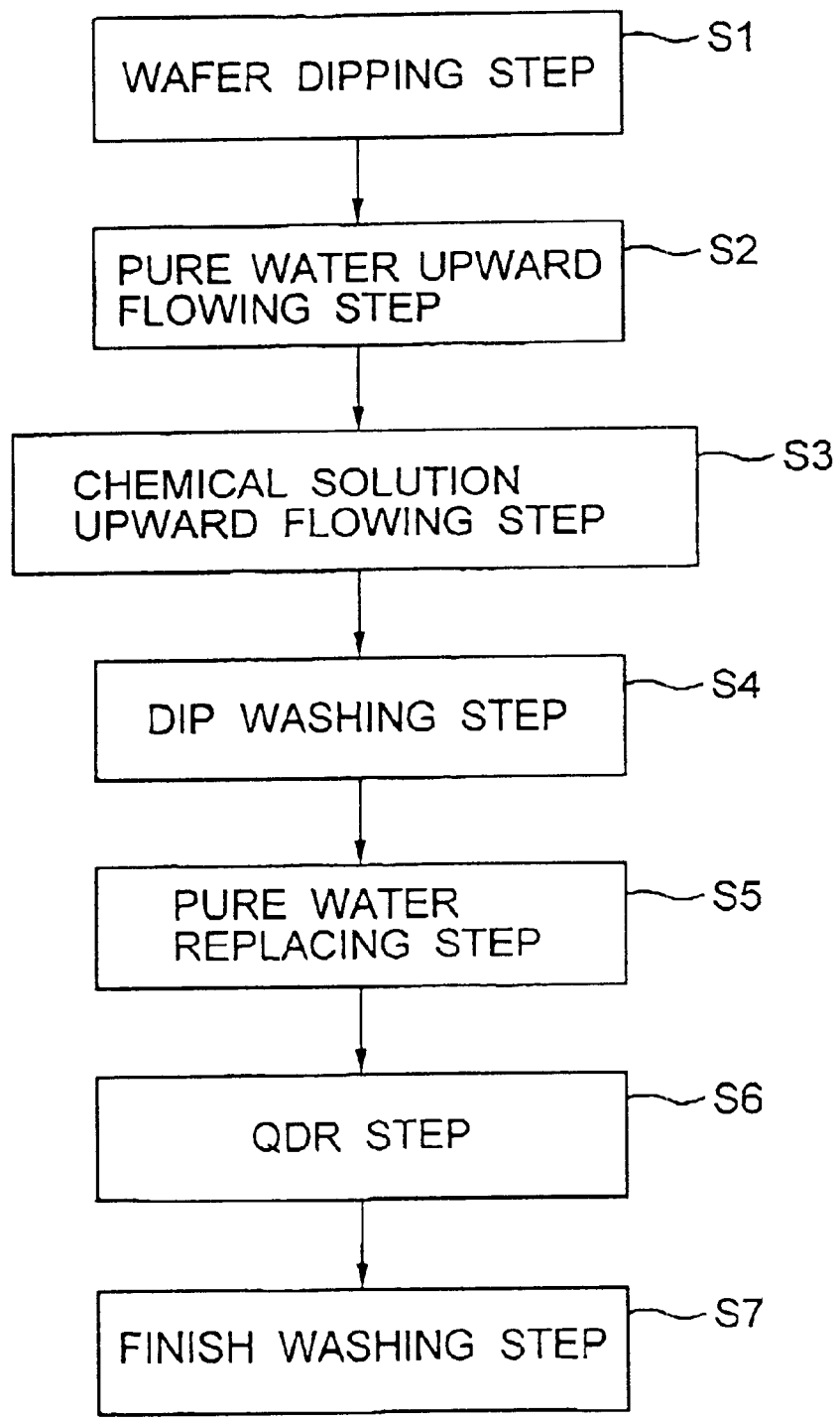
FIG. 3 is a flow chart showing procedures of a conventional wafer washing method.
Figure 4:
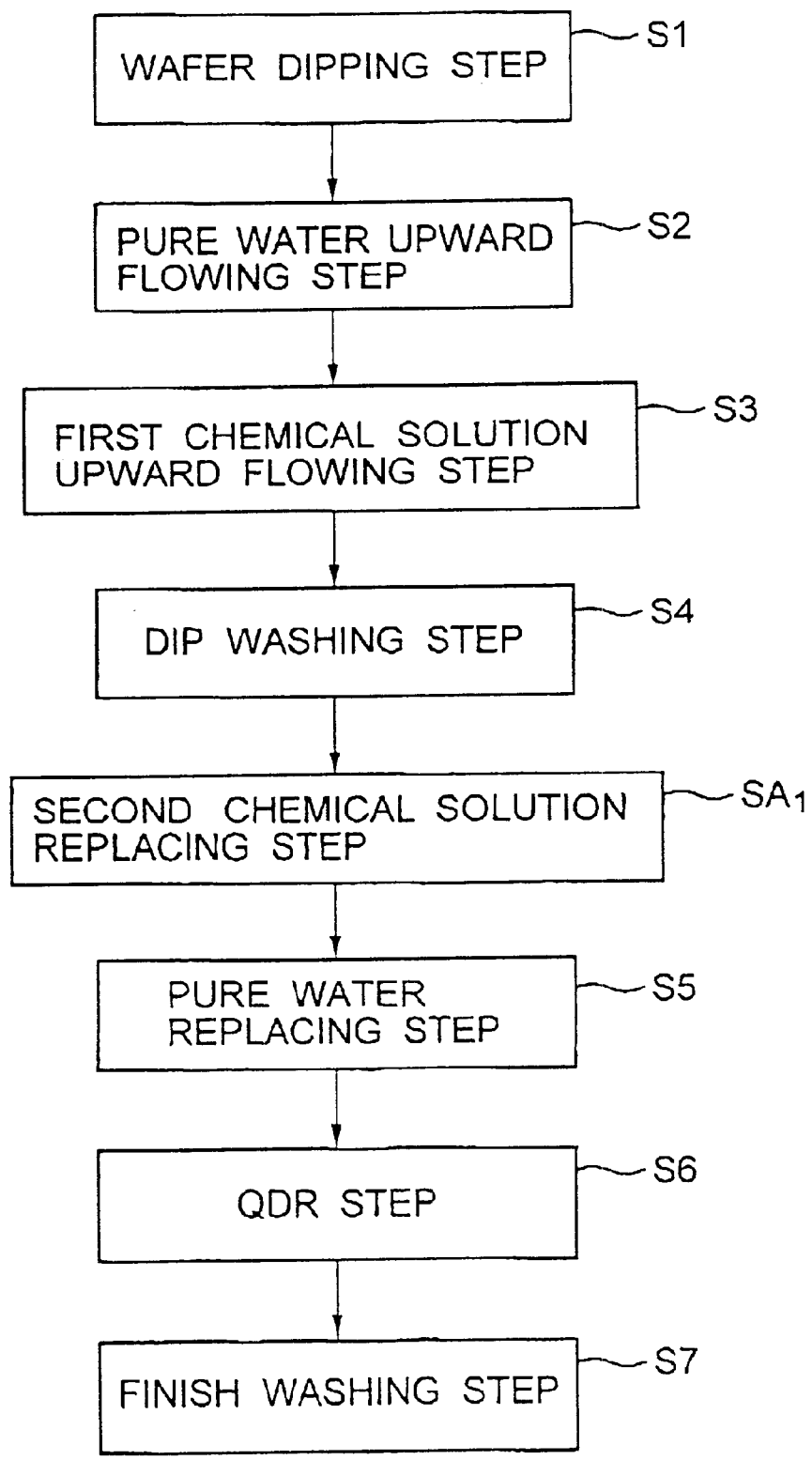
FIG. 4 is a flow chart showing procedures of washing a wafer in accordance with a first embodiment of the present invention.

A washing method of Embodiment 1 is conducted by using the single vessel-type wafer washing apparatus 10, and as shown in FIG. 4, the wafer dipping step $S_1$ to the dip washing step $S_4$ are similarly conducted to the conventional method as shown in FIG. 3.

At first, pure water is supplied to the inner chamber 12 at a rate of 5 liters/min. through the pipes 18A and 18B and is allowed to be over-flown from the inner chamber 12 to the outer chamber 14. While maintaining the overflow of the pure water, the lifter 16 mounting the wafers is dipped into the pure water in the inner chamber 12 ($S_1$: wafer dipping step).

Then, pure water is supplied to the inner chamber 12 at a flow rate of 20 liter/min. for 2 minutes through the pipes 18A and 18B ($S_2$: pure water upward flowing step).

After the supply of the pure water is stopped, a first chemical solution including ammonia, hydrogen peroxide and pure water in a volume ratio of 1:1:50 is supplied to the inner chamber 12 at a flow rate of 20.8 liter/min. for 120 seconds through the pipes 18A and 18B for washing the wafers ($S_3$: first chemical solution upward flowing step).

After the supply of the first chemical solution is stopped, the so-called dip washing is conducted for about 480 seconds while the wafers disposed on the lifter 16 are dipped in the first chemical solution ($S_4$: dip washing step).

The method of Embodiment 1 includes a second chemical solution replacing step $SA_1$. In this step, a second chemical solution including ammonia, hydrogen peroxide and pure water in a volume ratio of 1:1:100 is supplied to the inner chamber 12 at a flow rate of 20.4 liter/min. for 30 seconds through the pipes 18A and 18B. Thereby, the first chemical solution in the inner chamber 12 is replaced with the second chemical solution because the volume of the inner chamber is about 10 liters.

Alternatively, another method of preparing the second chemical solution is by diluting the first chemical solution with pure water. In this embodiment, the volume of the second chemical solution is not less than a volume of the washing chamber.

Similarly to the conventional method, only pure water is supplied to the inner chamber 12 at a flow rate of 20 liter/min. for 30 seconds through the pipes 18A and 18B for replacing the chemical solution in the inner chamber 12 with the pure water ($S_5$: pure water replacing step).

Then, QDR is conducted ($S_6$: QDR step). In the QDR washing, at first, the QDR drain port 20 is released to discharge the pure water in the inner chamber 12 supplied thereto in the pure water replacing step $S_5$. After the QDR drain port 20 is stopped to fill the inner chamber 12 with the pure water, the QDR drain port 20 is released again to discharge the pure water in the inner chamber 12. The procedures are repeated five or six times.

Then, only pure water is supplied to the inner chamber 12 at a flow rate of 20 liter/min. for 90 seconds through the pipes 18A and 18B, and a specific resistance of the pure water in the inner chamber 12 is confirmed to be substantially same as that of the pure water before the supply to the inner chamber 12, the lifter 16 is lifted to transfer the wafers to a drying chamber not shown ($S_7$: finish washing step).

In Embodiment 1, the particles floating in the first chemical solution is over-flown from the washing chamber together with the first chemical solution by replacing the first chemical solution with the second chemical solution, thereby discharging the particles from the washing chamber in the second chemical solution replacing step $SA_1$. Even if the particles are re-deposited onto the wafer during the step, the deposited particles are released by the releasing ability of the second chemical solution, thereby overflowing the particles from the washing chamber together with the first chemical solution.

Accordingly, the number of the particles remaining on the wafer is significantly reduced compared with a conventional method.

Embodiment 2

Figure 5:
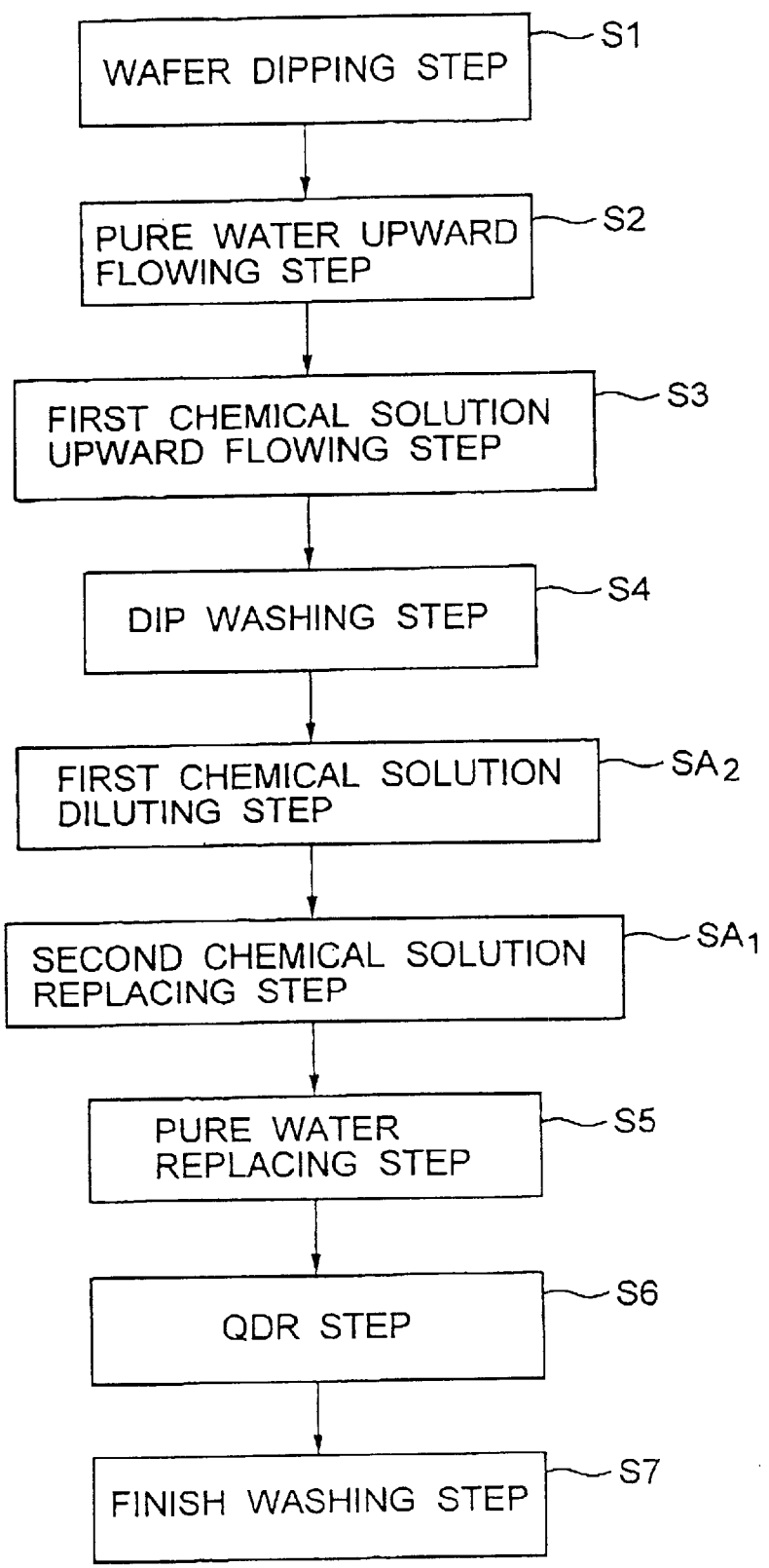
FIG. 5 is a flow chart showing procedures of washing a wafer in accordance with a second embodiment of the present invention.

A washing method of Embodiment 2 is conducted by using the single vessel-type wafer washing apparatus 10, and as shown in FIG. 5, the wafer dipping step $S_1$ to the dip washing step $S_4$ are similarly conducted to the conventional method.

The washing method of Embodiment 2 further includes a first chemical solution diluting step $SA_2$ and the second chemical solution replacing step $SA_1$.

In the first chemical solution diluting step $SA_2$ after the dip washing step $S_4$, pure water is supplied to the inner chamber 12 at a rate of 20 liter/min for 15 minutes through the pipes 18A and 18B to dilute the concentrations of the ammonia and the hydrogen peroxide of the first chemical solution in the inner chamber 12 to those of the second chemical solution.

After the supply of the pure water is stopped, a second chemical solution including ammonia, hydrogen peroxide and pure water in a volume ratio of 1:1:100 is supplied to the inner chamber 12 at a flow rate of 20.4 liter/min. for 15 seconds through the pipes 18A and 18B in the second chemical solution replacing step $SA_1$.

The dilution with the pure water and the supply of the second chemical solution replace the first chemical solution in the inner chamber 12 with the second chemical solution.

The dilution of the first chemical solution with the pure water reduces the concentration of the first chemical solution to that losing the ability of releasing the particles or that of the second chemical solution, and the first chemical solution is overflown from the inner chamber 12 to the outer chamber 14 together with the floating particles and discharge.

Even if the particles are re-deposited onto the wafer in the first chemical solution diluting step $SA_2$ and the second chemical solution replacing step $SA_1$, the deposited particles are released by the releasing ability of the second chemical solution and overflown from the washing chamber together with the first chemical solution. Accordingly, the number of the particles remaining on the wafer is significantly reduced compared with the conventional method.

Since the second chemical solution is supplied after the first chemical solution is diluted with the pure water, the amount of the second chemical solution can be curtailed.

After the second chemical solution replacing step $SA_1$, the pure water replacing step $S_5$, the QDR step $S_6$ and the finish washing step $S_7$ are conducted similarly to the conventional method.

Embodiment of Wafer Washing Apparatus

Figure 6:
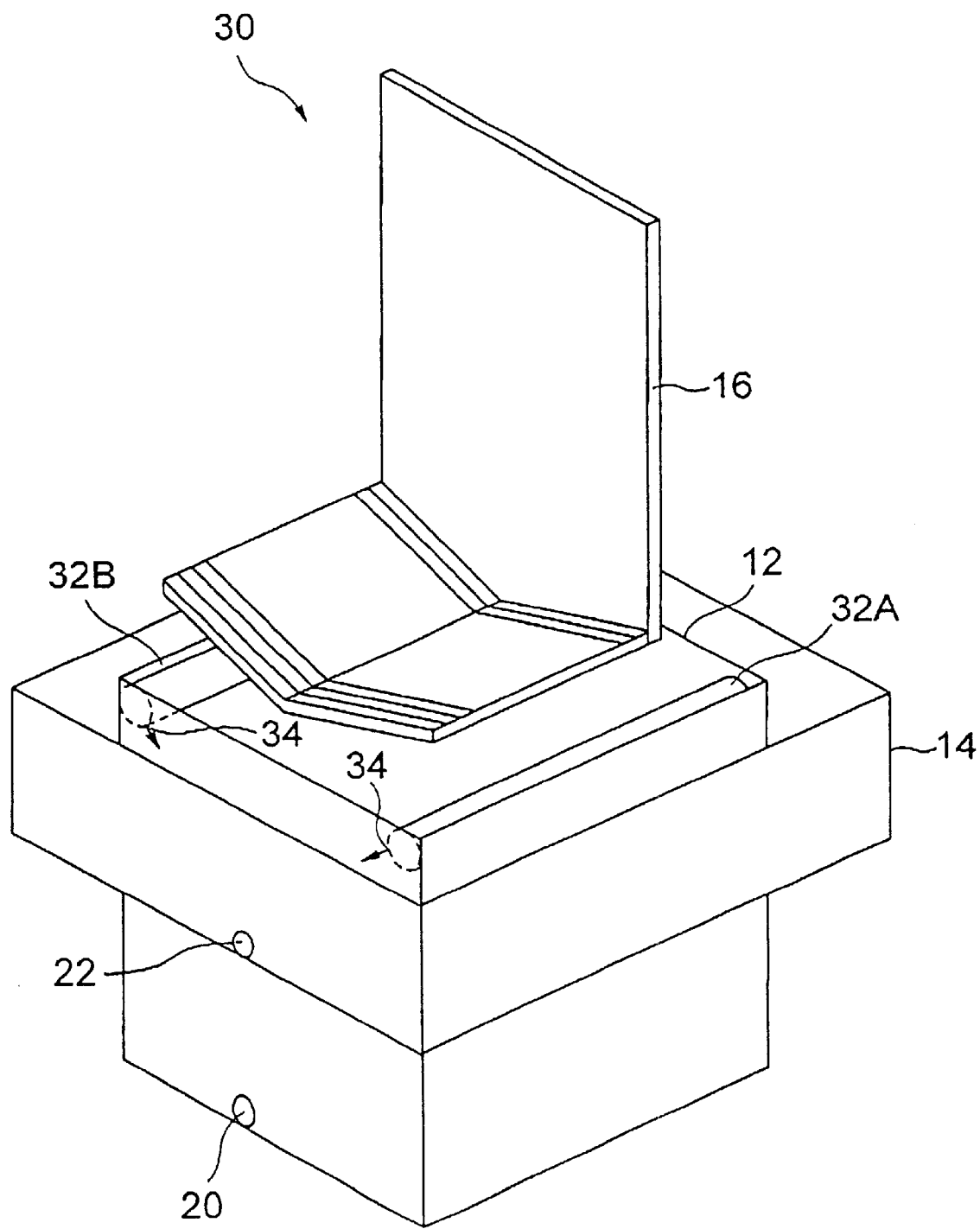
FIG. 6 is a perspective view showing a wafer washing apparatus in accordance with embodiments of the present invention.
Figure 7:
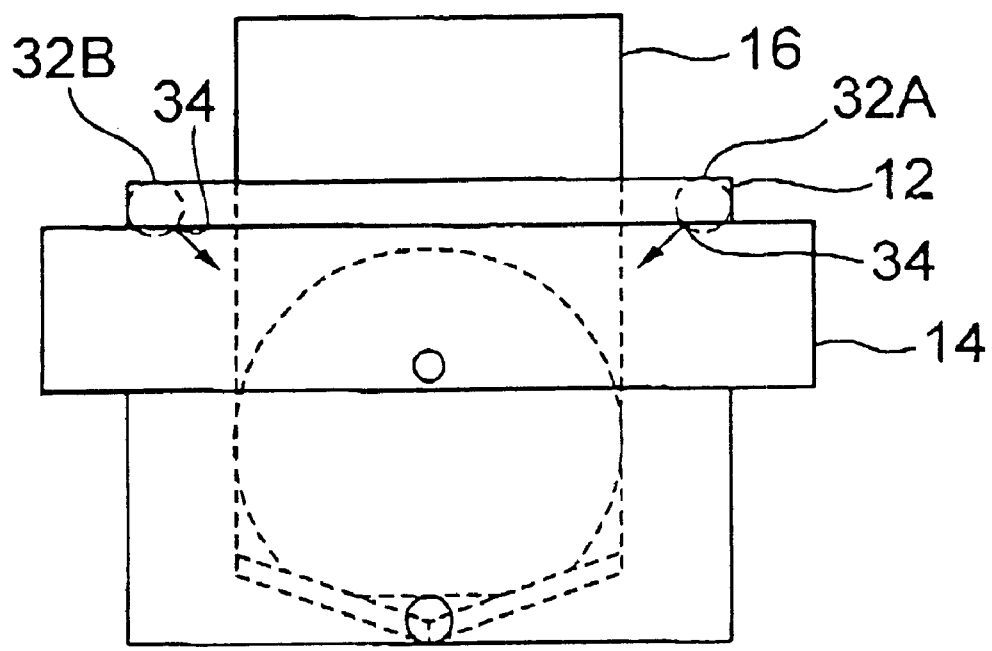
FIG. 7 is a front vertical view of the wafer washing apparatus of FIG. 6 in which a wafer is dipped.

A wafer washing apparatus of this Embodiment will be described referring to FIGS. 6 and 7. Description of elements in FIGS. 6 and 7 the same as those in FIGS. 1 and 2 will be omitted by affixing the same numerals thereto.

Figure 2:
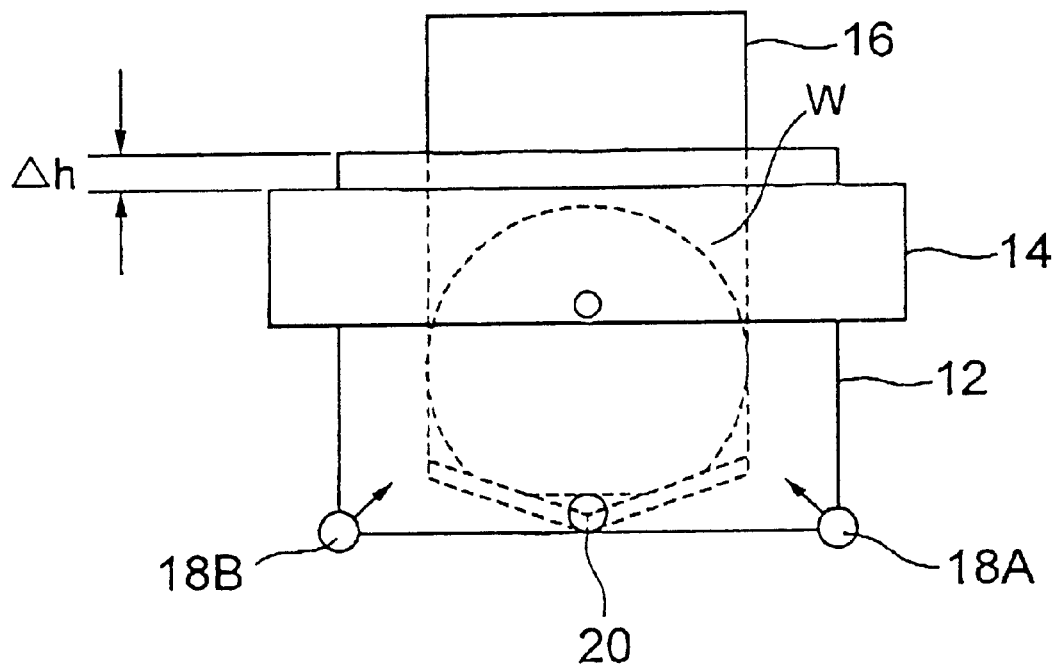
FIG. 2 is a front vertical view of the wafer washing apparatus of FIG. 1 in which a wafer is dipped.

The wafer washing apparatus 30 acting as a single vessel-type apparatus includes a similar configuration to that of the conventional washing apparatus as shown in FIGS. 1 and 2 except that pipes 32A and 32B having nozzles for ejecting the chemical solution and the pure water are disposed at an upper part of the inner chamber 12 in place of the pipes 18A and 18B disposed at the bottom of the inner chamber 12 as shown in FIGS. 1 and 2.

The pipes 32A and 32B are disposed along the both top ends of the inner chamber 12 in a direction of its width and include a plurality of nozzles 34 for obliquely ejecting the chemical solution and the pure water from the top.

Thereby, the first chemical solution in the inner chamber 12 can be uniformly replaced with the second chemical solution and the particles deposited onto the wafer bottom can be released after the dip washing step $S_4$.

Embodiment 3

A washing method of Embodiment 3 is conducted by using the single vessel-type wafer washing apparatus 30, and as shown in FIG. 8, the wafer dipping step $S_1$ to the dip washing step $S_4$ are similarly conducted to the method of Embodiment 3 except that the pure water or the first chemical solution is supplied to the inner chamber 12 through the pipes 32A and 32B. In Embodiment 3, the pure water is supplied downward to the wafer in the inner chamber 12, and the pure water upward flowing step $S_2$ in Embodiment 2 is referred to as pure water passing step $S_2$ in Embodiment 3.

As shown in FIG. 8 and similarly to Embodiment 2, the method of Embodiment 3 further includes a first chemical solution diluting step $SA_2$ and the second chemical solution replacing step $SA_1$.

In the first chemical solution diluting step $SA_2$ after the dip washing step $S_4$, pure water is supplied to the inner chamber 12 at a rate of 20 liter/min. for 15 minutes downward from the pipes 32A and 32B to dilute the concentrations of the ammonia and the hydrogen peroxide of the first chemical solution in the inner chamber 12 to those of the second chemical solution, and discharged.

After the supply of the pure water is stopped, a second chemical solution including ammonia, hydrogen peroxide and pure water in a volume ratio of 1:1:100 is supplied to the inner chamber 12 at a flow rate of 20.4 liter/min. for 15 seconds downward from the pipes 32A and 32B for replacing the first chemical solution with the second chemical solution in the second chemical solution replacing step $SA_1$.

After the second chemical solution replacing step $SA_1$, the pure water replacing step $S_5$, the QDR step $S_6$ and the finish washing step $S_7$ are conducted similarly to the conventional method.

Although the wafer washing apparatus 30 is used in this Embodiment, this Embodiment may be also conducted by using the conventional wafer washing apparatus 10.

Evaluation of Wafer Washing Method of Embodiments

The following tests were conducted for evaluating the washing effects of Embodiments 1 to 3.

Polystyrene latex (PLS) particles having a particle diameter of about 0.2 $\mu$m was added dropwise to 0.5 weight % hydrofluoric acid prepared by dissolving 1 weight part of hydrogen fluoride into 100 weight parts of water such that the weight ratio of the PLS particles was about 10 ppb, thereby preparing the hydrofluoric acid having the suspended PLS particles. After a wafer was dipped in the hydrofluoric acid for 5 to 6 minutes, the wafer was taken out and air-dried to obtain a test wafer having the deposited particles.

Then, the number of the PLS particles (A) deposited onto the wafer was counted by using a particle counter utilizing a laser light scattering system. The numbers were between 1000 and 10000.

The test wafer was washed by the method of Embodiment 1, and the number of the PLS particles after the washing (B) was counted. The removing rate of the particles was calculated by using the following equation.

Removing Rate (%)=(A−B)×100/A

A: number of PLS particles before washing.
B: number of PLS particles after washing.

Similarly, the removing rates attained by using the washing methods of Embodiments 2 and 3 were calculated to be 95% and over 99%, respectively.

For comparison, the removing rate attained by using the above-described conventional washing method was calculated to be less than 90%.

In view of the evaluation test results, the removing rates of Embodiments 1 to 3 were significantly improved compared with that of the conventional method.

In the washing method of Embodiment 3 using the wafer washing apparatus 30, the removing rate was over 99% similarly to Embodiment 1 though the amount of the second chemical solution was reduced similarly to Embodiment 2. This fact indicates that the wafer washing apparatus 30 of Embodiment had a higher washing effect.

Since the above embodiments are described only for examples, the present invention is not limited to the above embodiments and various modifications or alterations can be easily made therefrom by those skilled in the art without departing from the scope of the present invention.

What is claimed is:

1. A method for washing a wafer comprising the sequential steps of:

providing a washing chamber having a washing solution;

dipping the wafer in the washing solution in the washing chamber;

replacing the washing solution by a first chemical solution comprising ammonia ($NH_4OH$) and hydrogen peroxide ($H_2O_2$) as chemicals and water in a volume ratio between the chemicals and the water of $2:X_1$, wherein $20 \leq X_1 \leq 70$;

treating the wafer with the first chemical solution; and treating the wafer by replacing the first chemical solution with a second chemical solution comprising the ammonia and hydrogen peroxide as chemicals and water in a volume ratio between the chemicals and the water of $2:X_2$, wherein $80 \leq X_2 \leq 150$, said second chemical solution having a concentration lower than a concentration of said first chemical solution.

2. The method for washing the wafer as defined in claim 1, wherein a volume of the second chemical solution is not less than a volume of the washing chamber.

3. The method for washing the wafer as defined in claim 1 further including an additional step of diluting the first chemical solution with water to prepare the second chemical solution.

4. The method for washing the wafer as defined in claim 1, which comprises an additional step of quick dump rinsing.

5. The method of washing the wafer defined in claim 1 which additionally comprises a wafer upward flowing step.

6. The method for washing the wafer as defined in claim 3, wherein a volume of the second chemical solution is not less than a volume of the washing chamber.

* * * * *